(12) United States Patent
Harikai et al.

(10) Patent No.: US 10,964,597 B2
(45) Date of Patent: Mar. 30, 2021

(54) ELEMENT CHIP MANUFACTURING METHOD

(71) Applicant: Panasonic Intellectual Property Management Co., Ltd., Osaka (JP)

(72) Inventors: Atsushi Harikai, Osaka (JP); Shogo Okita, Hyogo (JP); Noriyuki Matsubara, Yamanashi (JP); Hidefumi Saeki, Osaka (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/567,047

(22) Filed: Sep. 11, 2019

(65) Prior Publication Data

US 2020/0098636 A1 Mar. 26, 2020

(30) Foreign Application Priority Data

Sep. 25, 2018 (JP) .............................. JP2018-179071

(51) Int. Cl.
*H01L 21/78* (2006.01)
*H01L 21/68* (2006.01)
*H01L 21/683* (2006.01)

(52) U.S. Cl.
CPC .......... *H01L 21/78* (2013.01); *H01L 21/6836* (2013.01)

(58) Field of Classification Search
CPC ................ H01L 21/78; H01L 21/6836; H01L 21/68721

USPC ................................................... 438/462, 613
See application file for complete search history.

(56) References Cited

U.S. PATENT DOCUMENTS

| | | | |
|---|---|---|---|
| 9,711,406 B2 * | 7/2017 | Martinez ................. | H01J 37/32 |
| 2003/0119328 A1 * | 6/2003 | Fujisato ............ | H01J 37/32449 438/709 |
| 2004/0221808 A1 * | 11/2004 | Kawano .............. | C23C 16/4401 118/715 |
| 2007/0217118 A1 * | 9/2007 | Ikuhara ............... | H01L 21/6833 361/234 |
| 2009/0139853 A1 * | 6/2009 | Yamamoto .......... | H01J 37/3452 204/192.1 |
| 2009/0252892 A1 * | 10/2009 | Weichart ........... | H01L 21/67201 427/569 |

(Continued)

FOREIGN PATENT DOCUMENTS

WO 2012/164857 A1 12/2012

*Primary Examiner* — Sheikh Maruf
(74) *Attorney, Agent, or Firm* — Pearne & Gordon LLP

(57) ABSTRACT

An element chip manufacturing method including: a preparing step of preparing a first conveying carrier including a holding sheet and a frame, and a substrate held on the holding sheet, the holding sheet having a first surface and a second surface opposite the first surface, the frame attached to at least part of a peripheral edge of the holding sheet; a placing step of placing the first conveying carrier holding the substrate, on a second conveying carrier; a preprocessing step of preprocessing the substrate, after the placing step; a removing step of removing the second conveying carrier, after the preprocessing step; and a dicing step of subjecting the substrate held on the first conveying carrier to plasma exposure, after the removing step, to form a plurality of element chips from the substrate.

7 Claims, 12 Drawing Sheets

(56) References Cited

U.S. PATENT DOCUMENTS

| | | | |
|---|---|---|---|
| 2010/0002354 A1* | 1/2010 | Inazumachi | H02N 13/00 361/234 |
| 2010/0216313 A1* | 8/2010 | Iwai | H01J 37/32623 438/729 |
| 2010/0252417 A1* | 10/2010 | Allen | H01J 37/3405 204/192.12 |
| 2011/0277933 A1* | 11/2011 | Nonomura | H01J 37/32935 156/345.28 |
| 2012/0021608 A1* | 1/2012 | Arita | H01L 24/27 438/703 |
| 2012/0238073 A1* | 9/2012 | Johnson | H01L 21/68742 438/464 |
| 2012/0329000 A1* | 12/2012 | Hirakawa | H01L 21/6719 432/5 |
| 2013/0230974 A1* | 9/2013 | Martinez | H01L 21/68771 438/464 |
| 2014/0109941 A1* | 4/2014 | Miyanari | H01L 21/6838 134/157 |
| 2015/0122776 A1* | 5/2015 | Okita | H01L 21/67069 216/67 |
| 2015/0221505 A1* | 8/2015 | Park | H01L 21/3086 438/782 |
| 2015/0340203 A1* | 11/2015 | Matsubara | H01L 21/6833 216/67 |
| 2016/0293469 A1* | 10/2016 | Okita | H01L 21/6833 |
| 2017/0271194 A1* | 9/2017 | Okita | H01J 37/32082 |
| 2018/0090333 A1* | 3/2018 | Matsubara | H01L 21/0274 |
| 2018/0240697 A1* | 8/2018 | Okita | H01L 21/68735 |
| 2019/0006238 A1* | 1/2019 | Matsubara | B23K 26/08 |
| 2019/0157100 A1* | 5/2019 | Harikai | H01L 21/31144 |
| 2019/0221479 A1* | 7/2019 | Okita | H01J 37/32623 |

* cited by examiner

ELEMENT CHIP MANUFACTURING METHOD

CROSS REFERENCE TO RELATED APPLICATION

The present application is based on and claims priority under 35 U.S.C. § 119 with respect to the Japanese Patent Application No. 2018-179071 filed on Sep. 25, 2018, of which entire content is incorporated herein by reference into the present application.

TECHNICAL FIELD

The present invention relates to an element chip manufacturing method, specifically to a method of individualizing or dicing a substrate attached on a conveying carrier, by means of plasma etching.

BACKGROUND

As a method of dicing a substrate provided with a plurality of element regions defied by a dicing region, plasma dicing technique has been known. In this technique, the substrate is plasma-etched along the dicing region and divided into a plurality of element chips. In recent years, electronic devices have been getting smaller and thinner in size, and electric components such as IC chips to be mounted on such electronic devices have been made thinner. In association with this, substrates for forming electric components such as IC chips to be subjected to plasma dicing have also been made thinner, causing the substrates to be prone to bend.

Aiming to improve easy handling of substrates or element chips in the processes such as transfer and pick-up, Patent Document 1 (WO 2012/164857) teaches placing a substrate held on a conveying carrier that includes a frame and a holding sheet covering an opening of the frame, on a stage provided in a plasma processing unit, and performing plasma dicing.

As the reduction in size and thickness of packages proceed, the thickness of the substrates has been further reduced. In electronic devices such as flash memories, due to advancement of multi-die stacking technologies, the substrate thickness has been reduced to about 30 μm. The substrate thickness is expected to be further reduced in the future, to be as small as about 10 μm.

Under such circumstances, in view of easy handling, each processing prior to plasma dicing also need to be carried out while the substrate is held on the conveying carrier. The thin substrate, however, is highly likely to break, when transferred between process steps. Moreover, in some cases, the substrate and the holding sheet are processed while chucked on the processing stage provided in each processing unit. Accordingly, when moving the conveying carrier away from the processing stage, the substrate may break. Also, the holding sheet may be stretched, causing wrinkles. If the holding sheet has wrinkles, wrinkles are likely to occur in the substrate when the substrate is set on the processing stage for the next process.

SUMMARY

One aspect of the present invention relates to an element chip manufacturing method including: a preparing step of preparing a first conveying carrier including a holding sheet and a frame, and a substrate held on the holding sheet, the holding sheet having a first surface and a second surface opposite the first surface, the frame attached to at least part of a peripheral edge of the holding sheet; a placing step of placing the first conveying carrier holding the substrate, on a second conveying carrier; a preprocessing step of preprocessing the substrate, after the placing step; a removing step of removing the second conveying carrier, after the preprocessing step; and a dicing step of subjecting the substrate held on the first conveying carrier to plasma exposure, after the removing step, to form a plurality of element chips from the substrate.

According to the present invention, high-quality element chips can be obtained.

DETAILED DESCRIPTION

Figure 1:
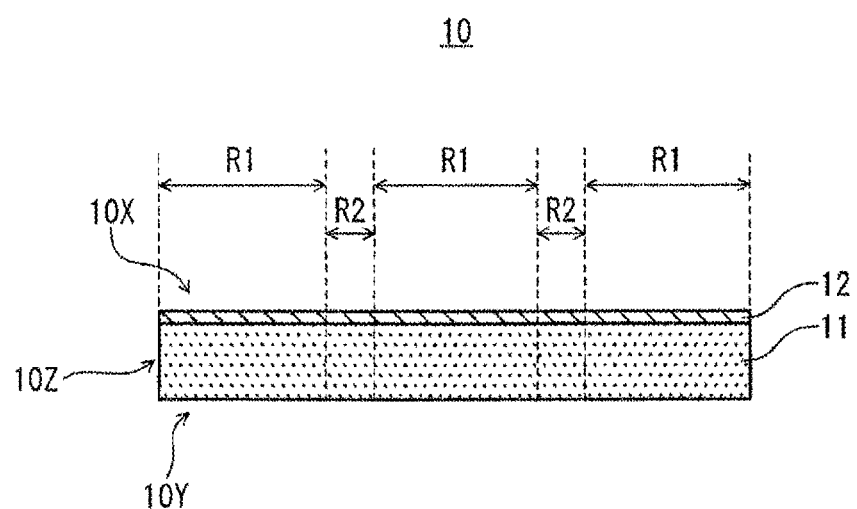
FIG. 1 is a schematic cross-sectional view of a substrate according to an embodiment of the present invention.

Prior to plasma dicing, a mask is formed on a substrate so as to cover element regions except a region (dicing region) to be plasma-etched. The mask is formed by a method including, for example, the steps of: applying a raw material liquid containing a raw material for the mask onto the substrate, to form an applied film; curing the applied film, to form a protective film; and patterning the protective film.

In the applying step, the raw material liquid is applied, for example, on the substrate set on a processing stage by spin coating or spray coating. In spray coating, the raw material liquid is transformed into mist by ultrasonic wave. Therefore, the raw material liquid tends to be electrically charged. The substrate to which such raw material liquid is applied, and further the holding sheet, also tend to be electrically charged. Consequently, electrostatic attraction is likely to occur between the substrate (and further the holding sheet) and the processing stage. Even after the application is completed, the substrate and the holding sheet may be held or chucked on the stage by the residual chucking force remaining on the processing stage.

The curing step for forming a protective film is carried out by, for example, heating or ultraviolet (UV) irradiation, depending on the raw material liquid to be used. Therefore, the holding sheet is likely to be softened and stick to the processing stage.

The patterning is carried out by, for example, using a laser beam. Therefore, the substrate surface tends to be electrically charged, and electrostatically chucked on the processing stage, with the holding sheet interposed therebetween. Furthermore, the above steps of applying a raw material liquid, curing the applied film, and patterning are often carried out while the substrate is vacuum-chucked on each processing stage. Therefore, even after each processing is completed, the substrate and the processing stage may be held or chucked to each other by the residual chucking force.

Each step is usually carried out by changing a processing unit. Specifically, it is often necessary to transfer the substrate between process steps, and every after the completion of each processing, move the substrate away from the processing stage. At this time, if the substrate is still chucked on the processing stage, or the holding sheet sticks to the processing stage, the substrate may break, or the holding sheet may be stretched. This may result in decrease in the yield and the quality of the element chips to be obtained.

To address this, the present embodiment uses a second conveying carrier that supports a first conveying carrier, and processes and transfers the substrate together with the second conveying carrier. By doing so, it is possible to avoid the holding sheet and the processing stage from being directly chucked or attached to each other, and prevent breakage of the substrate and stretching of the holding sheet. Furthermore, since the substrate can be more firmly supported on the holding sheet and the second conveying carrier, it is possible to prevent bending of the substrate during transfer. Moreover, it is possible to omit a step of eliminating static from the holding sheet every after the completion of each step. In this case, no ionizer is necessary, or the number of ionizers can be reduced.

In addition, it is possible to prevent dust adhesion to a surface of the holding sheet on the side supported on the second conveying carrier, as well as contamination and damage to the surface. In a later dicing step, the surface of the holding sheet on the side supported on the second conveying carrier will be in contact with the stage provided in a plasma processing unit. Protecting this surface can help to achieve good adhesion between the holding sheet and the stage, and to carry out plasma processing as desired.

Plasma dicing is carried out without the second conveying carrier. This is because, when moving the substrate away from the stage of the plasma processing unit, the substrate is already individualized, and the breakage problem hardly occurs. Also, this is due to the necessity of quickly releasing the heat accumulated in the substrate during plasma irradiation, via the processing stage.

A manufacturing method according to the present embodiment will be described below with reference to the drawings as appropriate. In illustrated examples, for the sake of convenience, members having the same function are denoted by the same reference numeral.

An element chip manufacturing method according to the present embodiment includes: a preparing step of preparing a first conveying carrier including a holding sheet and a frame, and a substrate held on the holding sheet, the holding sheet having a first surface and a second surface opposite the first surface, the frame attached to at least part of a peripheral edge of the holding sheet; a placing step of placing the first conveying carrier holding the substrate on a second conveying carrier; a preprocessing step of preprocessing the substrate, after the placing step; a removing step of removing the second conveying carrier, after the preprocessing step; and a dicing step of subjecting the substrate held on the first conveying carrier to plasma exposure, after the removing step, to form a plurality of element chips from the substrate.

(1) Preparing Step

First, a first conveying carrier and a substrate are prepared. The substrate is a subject of dicing. The substrate is schematically shown in cross section in FIG. 1.

(Substrate)

A substrate 10 is provided with a plurality of element regions R1, and a dicing region R2 defining the element regions R1. The substrate 10 has a third surface 10X not facing a holding sheet, and a fourth surface 10Y facing the holding sheet. The substrate 10 includes, for example, a semiconductor layer 11, and a circuit layer 12 laminated on the semiconductor layer 11 on the third surface 10X side. Etching the substrate 10 along the dicing region R2 produces element chips having the circuit layer 12.

The substrate 10 may be of any size, and the maximum diameter thereof is, for example, 50 mm or more and 300 mm or less. The substrate 10 may be of any shape, and is, for example, circular or rectangular. The substrate 10 may be provided with a cutout (not shown), such as an orientation flat or a notch.

The semiconductor layer 11 contains, for example, silicon (Si), gallium arsenide (GaAs), gallium nitride (GaN), or silicon carbide (SiC). The semiconductor layer 11 attached on the holding sheet may have any thickness; the thickness is, for example, 20 µm or more and 1000 µm or less, preferably 100 µm or more and 300 µm or less.

The circuit layer 12, which constitutes, for example, a semiconductor circuit, an electronic component element, or MEMS, may include an electrically insulating film, a metal material, a resin protection layer (e.g., polyimide layer), a resist layer, an electrode pad, a bump, and others. The insulating film may be in the form of a laminate with a wiring metal material (e.g., multilevel interconnect layer, redistribution layer).

Typically, after the circuit layer 12 is formed on the semiconductor layer 11, the semiconductor layer 11 is partially ground to thin the semiconductor layer 11 (thinning step). In the thinning step, the surface of the semiconductor layer 11 on the opposite side to the circuit layer 12 (fourth surface 10Y) is ground so that the substrate 10 has a desired thickness. Any type of grinder may be used, examples of which include a back-grinder provided with a diamond wheel.

The fourth surface 10Y of the substrate 10 is attached on a holding sheet secured on a frame.

Figure 2A:
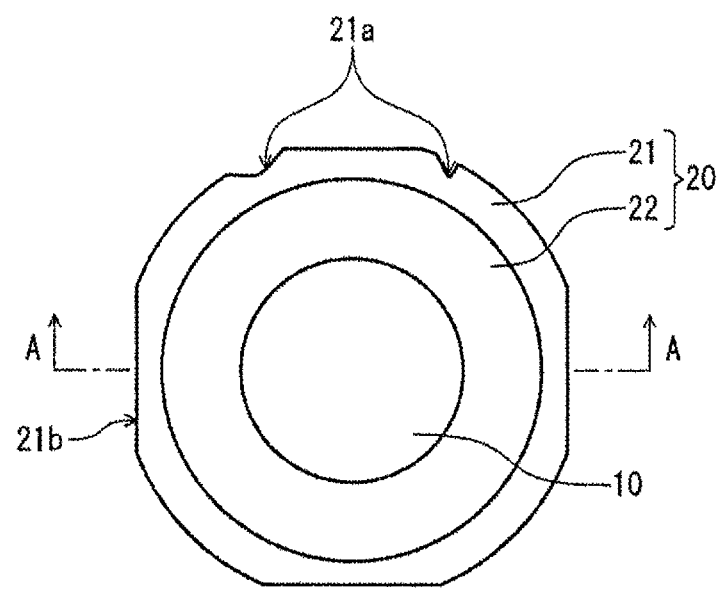
FIG. 2A is a schematic top plan view of a first conveying carrier for holding the substrate according to an embodiment of the present invention.
Figure 2B:
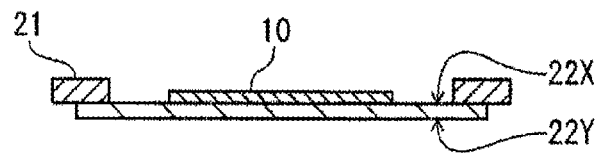
FIG. 2B is a cross-sectional view taken along a line A-A of FIG. 2A.

One embodiment of the holding sheet and the frame will be described with reference to FIGS. 2A and 2B. FIG. 2A is a schematic top plan view of a first conveying carrier for holding the substrate according to the present embodiment, and FIG. 2B is a cross-sectional view taken along a line A-A of FIG. 2A.

(Frame)

A frame 21 is a frame member having an opening which is equal to or greater in area than the whole substrate 10. The frame 21 has a predetermined width and a substantially consistent thin thickness. The frame 21 has such a rigidity that it can be transferred with the holding sheet 22 and the substrate 10 held thereon. The opening of the frame 21 may be of any shape, and may be, for example, circular, or polygonal such as rectangular or hexagonal. The frame 21 may be provided with a notch 21a and/or a corner cut 21b for correct positioning. The frame 21 can be made of, for example, a metal such as aluminum or stainless steel, or a resin. Hereinafter, the frame 21 and the holding sheet 22 secured on the frame 21 are collectively referred to as a first conveying carrier 20.

(Holding Sheet)

The holding sheet 22 may be made of any material. Preferably, the holding sheet 22 contains an adhesive layer and an elastic non-adhesive layer for easy attachment of the substrate 10 to the holding sheet 22.

The non-adhesive layer may be made of any material. Examples of the material include thermoplastic resins, such as polyolefins (e.g. polyethylene, polypropylene) and polyesters (e.g., polyethylene terephthalate). The non-adhesive layer may contain various additives. Examples of the additives include a rubber component for imparting elasticity (e.g., ethylene-propylene rubber (EPM), ethylene-propylene-diene rubber (EPDM)), a plasticizer, a softener, an antioxidant, and an electrically conductive material. The thermoplastic resins may have a functional group that reacts during photopolymerization reaction, such as an acryl group. The non-adhesive layer may have any thickness; the thickness is, for example, 50 µm or more and 300 µm or less, preferably 50 µm or more and 150 µm or less.

The holding sheet 22 is attached to the frame 21 such that the outer periphery of the surface on the adhesive layer side of the holding sheet 22 (first surface 22X) attaches to one of both surfaces of the frame 21, and the opening of the frame 21 is covered by the holding sheet 22. The substrate 10 is attached to the first surface 22X, which is partially exposed from the opening of the frame 21, such that the one of the principal surfaces of the substrate 10 (fourth surface 10Y) attaches to the first surface 22X. In plasma processing, they are placed on a stage provided in a plasma processing unit such that the surface on the non-adhesive layer side of the holding sheet 22 (second surface 22Y) comes in contact with the stage. This means that plasma etching is applied from the third surface 10X side of the substrate 10.

The adhesive layer is preferably made of an adhesive component, the adhesive strength of which is reduced by ultraviolet (UV) irradiation. In picking up element chips after plasma dicing, the element chips can be easily peeled off from the adhesive layer by UV irradiation, and can be picked up easily. The adhesive layer can be obtained by, for example, applying a UV curing acrylic adhesive on one side of the non-adhesive layer in a thickness of 5 µm or more and 100 µm or less, preferably 5 µm or more and 15 µm or less.

(2) Placing Step

Next, a second conveying carrier is prepared, and the first conveying carrier is placed on the second conveying carrier, so that the first conveying carrier is supported by the second conveying carrier.

(Second Conveying Carrier)

Figure 3:
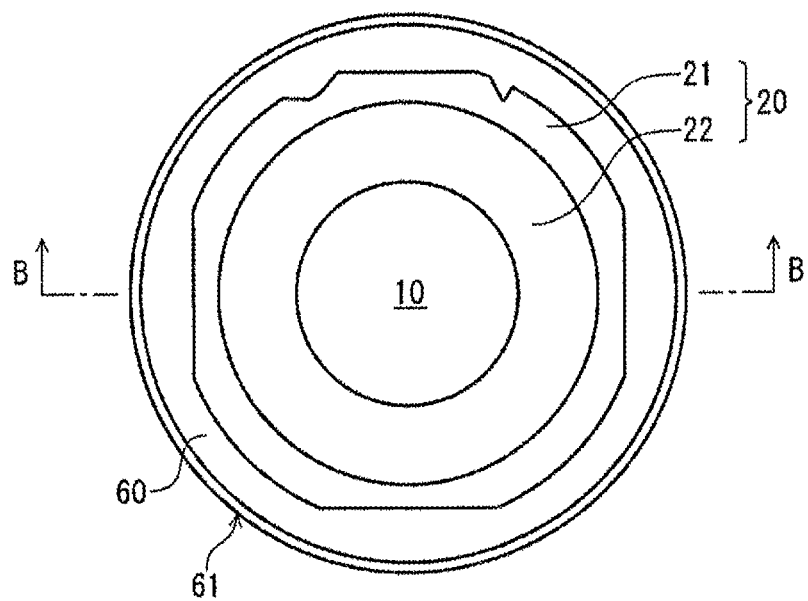
FIG. 3 is a schematic top plan view of the first conveying carrier, the substrate, and a second conveying carrier according to an embodiment of the present invention.

FIG. 3 is a schematic top plan view of the first conveying carrier, the substrate, and a second conveying carrier according to the present embodiment.

The maximum diameter of a second conveying carrier 60 may be larger than the outer diameter of the frame 21. In this case, the second conveying carrier 60 may have a first portion 61 that rises so as to surround the circumference of the frame 21. The first portion 61 serves to prevent the drop-off of the first conveying carrier 20 and make positioning of the first conveying carrier 20. When the second conveying carrier 60 is shaped like a flat plate without the first portion 61, the second conveying carrier 60 is only required to have a maximum diameter larger than the diameter of the substrate 10.

The second conveying carrier 60 may be made of any material that has such a rigidity that it can support the first conveying carrier 20. The second conveying carrier 60 may include, for example, a glass plate, a resin plate, a metal plate, or ceramics.

The resin plate is preferably made of a material which is hardly softened in a later-described curing step of curing a raw material of a protective film. Examples of such a material of the resin plate include a thermoplastic resin having a softening point of 120° C. or higher, a cured product of a thermosetting resin or a UV curable resin. Examples of the thermoplastic resin include polyester, polystyrene, and polytetrafluoroethylene. Examples of the thermosetting resin include epoxy resin, polyimide, and polyamide-imide. Examples of the UV curable resin includes acrylic resin. The metal plate may be made of, for example, aluminum, or stainless steel. Examples of the ceramics include aluminum oxide, zirconium dioxide, aluminum nitride, and silicon nitride.

First Embodiment

The second conveying carrier may support the substrate, with the holding sheet interposed therebetween.

Figure 4A:
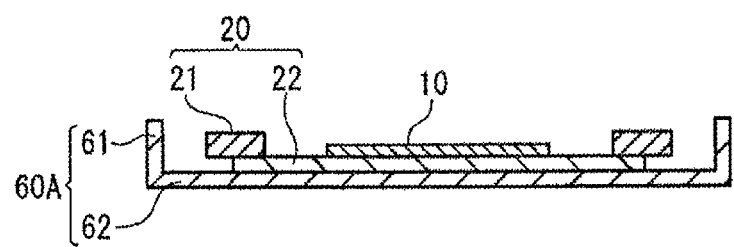
FIG. 4A is a schematic cross-sectional view of the first conveying carrier, the substrate, and a second conveying carrier according to an embodiment of the present invention.

FIG. 4A is a schematic cross-sectional view of the first conveying carrier, the substrate, and a second conveying carrier according to the present embodiment. FIG. 4A is a cross-sectional view taken along a line B-B of FIG. 3.

A second conveying carrier 60A has the first portion 61 that rises so as to surround the circumference of the frame 21, and a second portion 62 of flat plate-like shape. The minimum diameter of the second portion 62 is larger than the outer diameter of the frame 21. The first portion 61 and the second portion 62 may be integrally formed in one piece or may be a combination of different pieces.

The second portion 62 may be provided with a through-hole in a region facing the substrate 10. This makes it easy for the substrate 10 to be vacuum-chucked on the processing stage in a later-described mask forming step. A through-hole may be provided in a region facing the frame 21 of the second portion 62. In this case, in a later-described removing step, the first conveying carrier 20 can be pushed up with a push-up pin through the through-hole, and thereby can be easily moved away from the second conveying carrier 60A.

Within the second portion 62, a portion in contact with the holding sheet 22 may have a rough surface. This prevents the second portion 62 and the holding sheet 22 from being chucked or attached to each other, allowing the removing step to proceed smoothly, as well as preventing the holding sheet 22 from being damaged. The surface roughness may be formed by grinding or blasting the contacting portion. The degree of roughness on the surface of the contacting portion is not limited.

Within the second portion 62, a portion in contact with the holding sheet 22 may have electrical conductivity. This makes it difficult for static to stay between the holding sheet 22 and the contacting portion, allowing the removing step to proceed smoothly, as well as preventing the holding sheet 22 from being damaged. The second portion 22 having electrical conductivity may be made of, for example, a metal plate, or a glass or resin plate containing electrically conductive filler or fibers.

Within the second portion 62, an electrostatic chuck system may be housed in an area corresponding to the substrate 10. Turning on the electrostatic chuck system can secure the substrate 10 in position, and thereby can enhance the accuracy of each processing. On the other hand, turning off the electrostatic chuck system makes it easy to move the first conveying carrier 20 away from the second conveying carrier 60.

The second portion 62 may have any thickness. The thickness of the second portion 62 may be, for example, 100 µm or more and 5 mm or less, or 500 µm or more and 2 mm or less.

Prior to dicing, a mask is typically formed. The mask is formed through, for example, coating and curing steps of forming a protective film 40 on the substrate 10, and a patterning step of forming an aperture in the protective film 40 to expose the third surface along the dicing region R2.

The step of placing on the second conveying carrier 60A according to the first embodiment may be carried out after the preparing step, before either one of the steps of coating, curing, and patterning, or before every one of the steps of coating, curing, and patterning. The step of removing the second conveying carrier 60A according to the first embodiment may be carried out after the steps of coating, curing, and patterning, and before the dicing step.

Second Embodiment

The second conveying carrier may be an annular body. In this case, the second conveying carrier supports the frame.

Figure 4B:
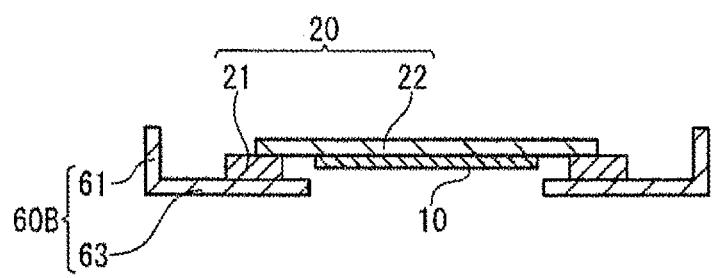
FIG. 4B is a schematic cross-sectional view of the first conveying carrier, the substrate, and a second conveying carrier according to another embodiment of the present invention.

FIG. 4B is a schematic cross-sectional view of the first conveying carrier, the substrate, and a second conveying carrier according to the present embodiment. FIG. 4B is a cross-sectional view taken along the line B-B of FIG. 3.

A second conveying carrier 60B has the first portion 61 that rises so as to surround the circumference of the frame 21, and a ring-like third portion 63 that supports at least the frame 21. As illustrated in FIG. 4B, the first conveying carrier 20 may be held on the second conveying carrier 60B, with the substrate 10 exposed from a window formed by the third portion 63. The first portion 61 and the third portion 63 may be integrally formed in one piece or may be a combination of different pieces.

The third portion 63 may have any thickness. The thickness of the third portion 63 may be, for example, 100 µm or more and 5 mm or less, or 500 µm or more and 2 mm or less.

The step of placing on the second conveying carrier 60B according to the second embodiment may be carried out after the steps of preparing and coating, and before the curing step. In this case, the curing step may be carried out, as illustrated in FIG. 4B, with the processing surface of the substrate 10 (third surface 10X) faced downward. The step of removing the second conveying carrier 60B according to the second embodiment may be carried out after the curing step, and before the patterning step.

Third Embodiment

The second conveying carrier may has a flat plate-like member that supports the substrate, with the holding sheet interposed therebetween, and a ring-like member that supports the frame.

Figure 4C:
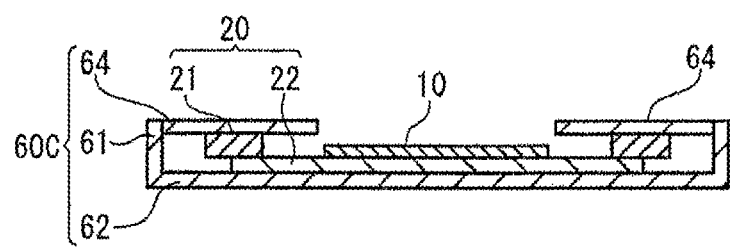
FIG. 4C is a schematic cross-sectional view of the first conveying carrier, the substrate, and a second conveying carrier according to still another embodiment of the present invention.

FIG. 4C is a schematic cross-sectional view of the first conveying carrier 20, the substrate 10, and a second conveying carrier according to the present embodiment. FIG. 4C is a cross-sectional view taken along the line B-B of FIG. 3.

A second conveying carrier 60C has the first portion 61 that rises so as to surround the circumference of the frame 21, the flat plate-like second portion 62 that supports the holding sheet 22, and a ring-like fourth portion 64 that supports the frame 21 from the opposite side to the holding sheet 22. The minimum diameter of the second portion 62 is larger than the outer diameter of the frame 21. As illustrated in FIG. 4C, the first conveying carrier 20 may be held on the second conveying carrier 60C, with the substrate 10 exposed from a window formed by the fourth portion 64. The first portion 61, the second portion 62, and the fourth portion 64 may be integrally formed in one piece or may be a combination of different pieces.

The second portion 62 and the fourth portion 64 may have any thickness. The thickness of each of the second and fourth portions 62 and 64 may be, for example, 100 µm or more and 5 mm or less, or 500 µm or more and 2 mm or less.

In the present embodiment, the frame 21 is doubly supported by the second portion 62, with the holding sheet 22 interposed therebetween, and by the fourth portion 64 from the opposite side to the holding sheet 22. Therefore, the preprocessing step can be carried out, with the processing surface of the substrate 10 (third surface 10X) faced either upward or downward.

The step of placing on the second conveying carrier 60C according to the third embodiment may be carried out after the preparing step, before either one of the steps of coating, curing, and patterning, or before every one of the steps of coating, curing, and patterning. The step of removing the second conveying carrier 60C may be carried out after the steps of coating, curing, and patterning, and before the dicing step.

(3) Preprocessing Step

The preprocessing step includes, for example, a mask forming step. The mask forming step includes at least one of the following steps: a coating step of coating the third surface 10X of the substrate 10 to be held on the holding sheet 22 with a raw material of a protective film; a curing step of curing the raw material, to form the protective film on the third surface 10X; and a patterning step of forming an aperture in the protective film, to expose the substrate 10 along the dicing region R2.

(3-1) Coating Step and Curing Step

A protective film that covers the substrate 10 is formed.

Figure 5:
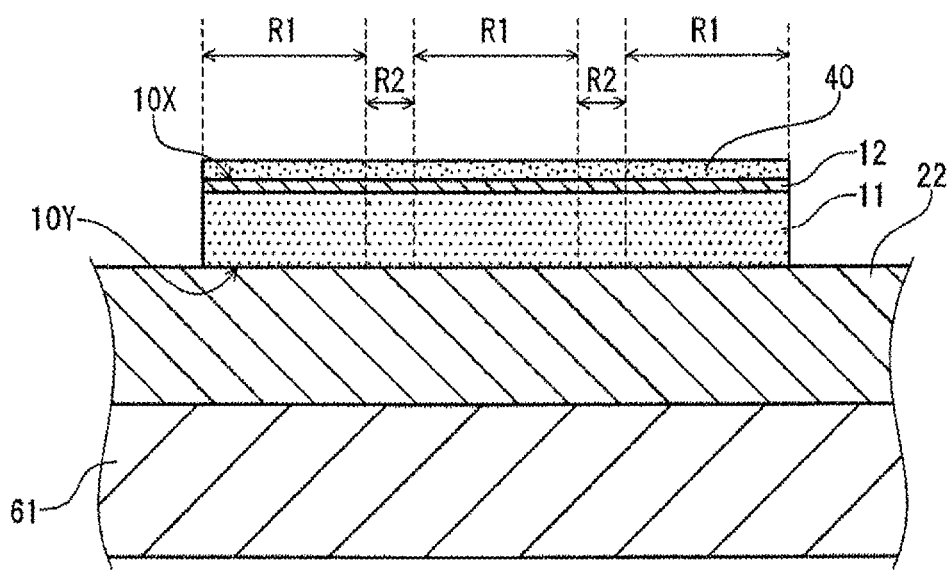
FIG. 5 is a schematic cross-sectional view of the substrate in a coating step and a curing step according to the embodiments of the present invention.

FIG. 5 is a schematic cross-sectional view of the substrate in the coating step and the curing step.

The protective film 40 is provided for protecting the element regions R1 of the substrate 10 from plasma exposure or the like.

The protective film 40 may have any thickness, but is preferably thick enough so as not be completely removed by plasma etching in the dicing step. The thickness of the protective film 40 can be set, for example, by calculating an amount (thickness) of the protective film 40 to be etched in the dicing step, to be thicker than the amount. The amount to be etched of the protective film 40 can be calculated, for example, depending on the thickness of the semiconductor layer 11 subjected to etching in the dicing step. For example, when the semiconductor layer 11 is a silicon layer of 30 µm thick, it suffices if the protective film 40 has a thickness of 15 µm or more and 50 µm and less The protective film 40 contains a resist material, such as a thermosetting resin (e.g., polyimide), a photoresist (e.g., phenol resin), or a water-soluble resist (e.g., acrylic resin).

The protective film 40 can be formed by, for example, forming a raw material containing the resist material into a sheet, and attaching the sheet to the third surface 10X, or by applying a raw material liquid of the resist material to the third surface 10X using spin-coating or spray-coating technique, followed by curing. Applying the raw material liquid while adjusting its amount can locally change the thickness of the protective film 40. The applying amount may be adjusted by using spin-coating and spray-coating techniques in combination.

In the coating step, the substrate 10 may be placed on the processing stage and vacuum-chucked. This embodiment is suitable for the second conveying carriers 60A and 60C. In this case, even after the vacuum is released, residual vacuum might remain between the substrate 10 and the processing stage. Even so, however, after processing, the substrate 10 and the holding sheet 22 are, together with the second conveying carrier 60, moved away from the processing stage and transferred. Therefore, breakage of the substrate 10 and stretching of the holding sheet 22 can be suppressed.

In the curing step, the raw material containing the resist material is cured. The method of curing the raw material can be selected as appropriate from heating, UV irradiation, and other methods, depending on the type of the resist material.

The curing step may be carried out while the substrate 10 is set on the processing stage. This embodiment is suitable for the second conveying carriers 60A and 60C that support the substrate 10, with the holding sheet 22 interposed therebetween. Even when the holding sheet 22 is softened by heating or UV irradiation, after processing, the substrate 10 and the holding sheet 22 are, together with the second conveying carrier 60, moved away from the processing stage and transferred. Therefore, stretching of the holding sheet 22 can be suppressed. Furthermore, like in the coating step, the substrate 10 may be vacuum-chucked on the processing stage. In this case also, likewise, breakage of the substrate 10 and stretching of the holding sheet 22 in moving away from the processing stage and conveying can be suppressed.

In the above case, heat or UV may be applied or irradiated to the substrate 10 from the third surface 10X side, while cooling the processing stage facing the fourth surface 10Y. This can reduce the stretching of the holding sheet 22 due to heat, as well as the quality change of the holding sheet 22.

In the curing step, curing may be carried out, with the first conveying carrier 20 reversed such that the third surface 10X of the substrate 10 faces the processing stage, and moved away from the processing stage. Heating and UV irradiation are performed by using, for example, a unit provided within or in proximity to the processing stage. This embodiment is suitable for the second conveying carriers 60B and 60C. In this case, the holding sheet 22 is preferably exposed as less as possible from the window formed by the third or fourth portion 63 or 64. This is helpful in preventing damage to the holding sheet 22. In other words, the third and fourth portions 63 and 64 serve to protect the holding sheet 22 from heat or UV.

(3-2) Patterning Step

An aperture is formed in the protective film 40, to expose the substrate 10 along the dicing region R2. In this way, a mask is formed.

Figure 6:
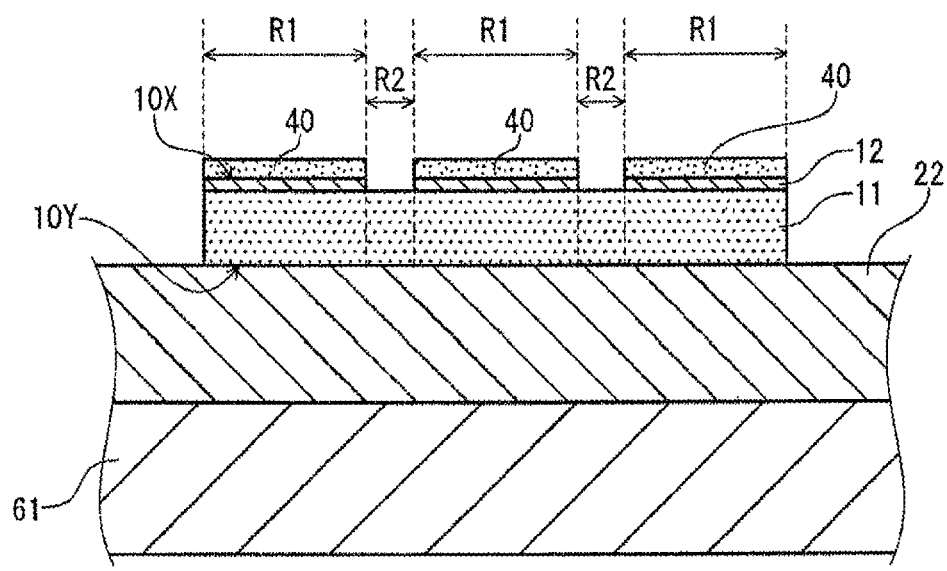
FIG. 6 is a schematic cross-sectional view of the substrate in a pattering step according to the embodiments of the present invention.

FIG. 6 is a schematic cross-sectional view of the substrate in a pattering step.

When the protective film 40 is made of a photoresist, the aperture can be formed by removing a region corresponding to the dicing region R2, by means of photolithography. When the protective film 40 is made of a thermosetting resin or a water-soluble resist, the aperture can be formed by removing a region corresponding to the dicing regions R2, by means of laser scribing.

In the case of laser scribing, plasma is locally generated on the surface of the substrate 10 at places irradiated with laser. Accordingly, the substrate 10 is electrically charged in some cases, causing the substrate 10 to be electrostatically chucked on the processing stage, with the holding sheet interposed therebetween. Furthermore, in the patterning step, there is a case where the substrate 10 is vacuum-chucked on the processing stage. Even in this case, however, after processing, the substrate 10 and the holding sheet 22 are, together with the second conveying carrier 60, moved away from the processing stage and transferred. Therefore, breakage of the substrate 10 and stretching of the holding sheet 22 can be suppressed.

In this step, as illustrated in FIG. 6, the semiconductor layer 11 may be exposed along the dicing region R2. Specifically, in this step, the circuit layer 12 may be separated into plural areas in correspondence with the element regions R1. The separation of the circuit layer 12 is performed by means of, for example, laser scribing, mechanical dicing, or plasma etching. The separation of the circuit layer 12 may be carried out in the step of preparing the substrate. When plasma etching is employed, the separation of the circuit layer 12 may be carried out in a later-described dicing step. In this case, the conditions for generating plasma for removing the circuit layer 12 may be different from those for dicing. For example, the circuit layer 12 is removed first by plasma produced from an Ar-containing process gas, and then, the plasma generating conditions are changed to those for the Bosch process, to etch the semiconductor layer 11.

(4) Removing Step

The second conveying carrier 60 is removed from the second surface 22Y of the holding sheet 22.

The second conveying carrier 60 is not attached to the first conveying carrier 20, and therefore, can be easily removed.

Figure 7:
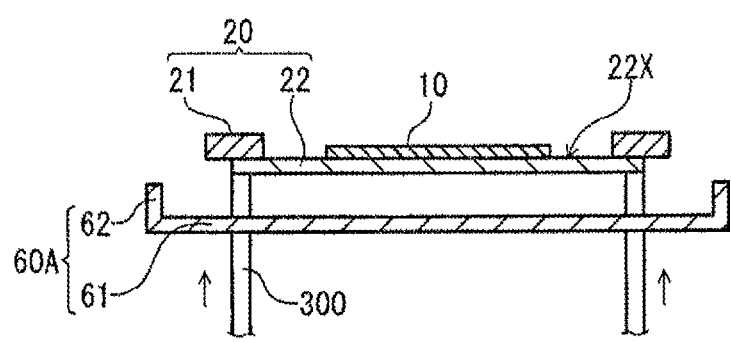
FIG. 7 is a schematic cross-sectional view of the first conveying carrier and the second conveying carrier shown in FIG. 4A in a removing step.

FIG. 7 is a schematic cross-sectional view of the second conveying carrier of FIG. 4A when removed from the first conveying carrier.

The first conveying carrier 20 is pushed up with push-up pins 300 through through-holes (not shown) in the second conveying carrier 60A, and moved away from the second conveying carrier 60A. Thereafter, a transfer arm receives the first conveying carrier 20 and delivers it to the next step.

In view of reducing damage to the holding sheet 22 and the substrate 10, the push-up pins 300 may be arranged such that the frame 21 is pushed up, with the holding sheet 22 interposed therebetween. In this case, the through-holes in the second conveying carrier 60A are formed so as to face the frame 21 of the first conveying carrier 20. In view of pushing up the first conveying carrier 20 with keeping it horizontally, three or more push-up pins 300 may be used to push up the frame 21. In this case, three or more through-holes are formed in the second conveying carrier 60A. A plurality of through-holes may be formed with equally spaced apart from each other in correspondence to the shape of the frame 21, or formed point-symmetrically with respect to the center of the frame 21.

In the case of the second conveying carrier 60B of FIG. 4B, a transfer arm grips the frame 21 from the holding sheet 22 side, and lifts it up. The first conveying carrier 20 is thus moved away from the second conveying carrier 60B. Then, the first conveying carrier 20 is delivered to the next step by the transfer arm.

In the case of the second conveying carrier 60C of FIG. 4C, the fourth portion 64 is detached first, and then, like the second conveying carrier 60A, push-up pins are used to move the first conveying carrier 20 away from the second conveying carrier 60C. Alternatively, the second portion 62 (and the first portion 61) is detached first, and then, like the second conveying carrier 60B, a transfer arm that grips the frame 21 from the holding sheet 22 side is used to move the first conveying carrier 20 away from the second conveying carrier 60C.

(5) Dicing Step

Figure 8:
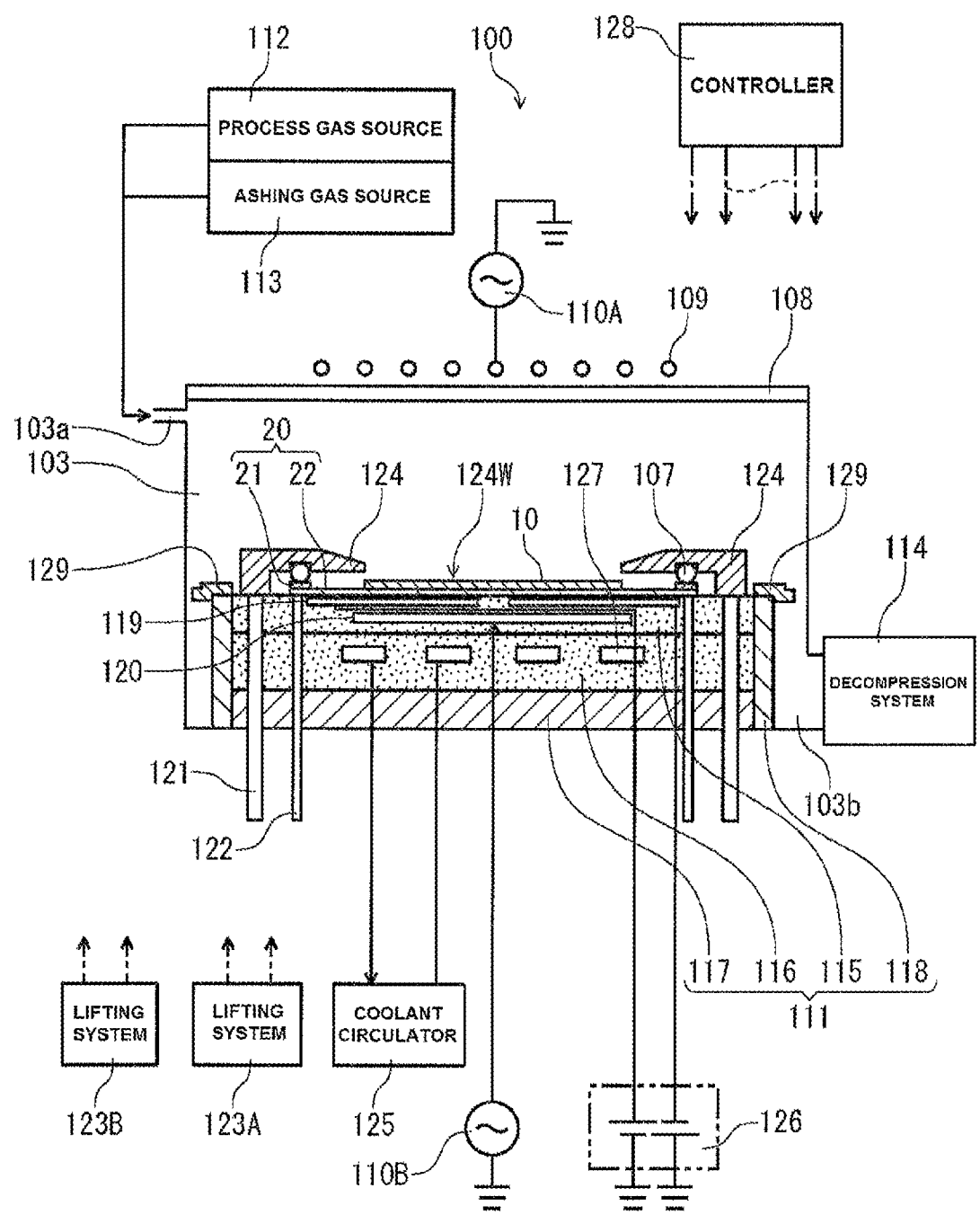
FIG. 8 is a conceptual cross-sectional diagram of a plasma processing unit.

Referring to FIG. 8, a plasma processing unit used for plasma dicing in the dicing step will be specifically described. The plasma processing unit is not limited thereto. FIG. 8 depicts a schematic structure in a cross section of the plasma processing unit, in which the protective film is omitted for the sake of convenience.

(Plasma Processing Unit)

A plasma processing unit 100 includes a stage 111. The first conveying carrier 20 is set on the stage 111, with the surface holding the substrate 10 of the holding sheet 22 faced upward. The stage 111 has such a size that the whole first conveying carrier 20 can be seated thereon. Above the stage 111, a cover 124 having a window 124W for exposing at least part of the substrate 10 therefrom is arranged. The cover 124 is provided with holding members 107 for holding the frame 21 downward while the frame 21 is set on the stage 111. The holding members 107 are preferably a member that can achieve point contact with the frame 21, such as a coil spring or an elastic resin. This can correct a distortion of the frame 21, while restricting a thermal communication between the frame 21 and the cover 124.

The stage 111 and the cover 124 are arranged in a vacuum chamber 103. The vacuum chamber 103 is approximately cylindrical with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is positioned on the bottom side in the vacuum chamber 103.

The vacuum chamber 103 is provided with a gas inlet 103a for introducing gas, and a gas outlet 103b for exhausting gas. The gas inlet 103a is connected to plasma-generating gas (process gas) supply sources, a process gas source 112 and an ashing gas source 113, each through a conduit. The gas outlet 103b is connected to a decompression system 114 including a vacuum pump for exhausting the gas within the vacuum chamber 103 to reduce the pressure therein. While the vacuum chamber 103 is supplied with a process gas, the first electrode 109 is supplied with a high-frequency power from the first high-frequency power source 110A. A plasma is thus generated in the vacuum chamber 103.

The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as listed above.

Within the electrode layer 115, an electrostatic chuck (ESC) electrode 119, and a second electrode 120 electrically connected to a second high-frequency power source 110B are disposed. The ESC electrode 119 is electrically connected to a DC power source 126. An electrostatic chuck system is composed of the ESC electrode 119 and the DC power source 126. The electrostatic chuck system pulls the holding sheet 22 onto the stage 111 and secures it thereto. Although a description will be made below of a case where the electrostatic chuck system is used as a securing system for securing the holding sheet 22 to the stage 111, this should not be taken as a limitation. A clamp (not shown) may be used for securing the holding sheet 22 to the stage 111.

The metal layer 116 is formed of, for example, aluminum with an anodic oxidation coating. The metal layer 116 contains a coolant channel 127 configured to cool the stage 111. By cooling the stage 111, the holding sheet 22 set on the stage 111 is cooled down, and the cover 124 partially in contact with the stage 111 is also cooled down. This protects the substrate 10 and the holding sheet 22 from being damaged by being heated during plasma processing. A coolant in the coolant channel 127 is circulated by a coolant circulator 125.

Around the peripheral portion of the stage 111, a plurality of support members 122 extending through the stage 111 are provided. The support members 122 support the frame 21 of the first conveying carrier 20. The support members 122 are driven by a lifting system 123A, and move upward and downward. The first conveying carrier 20 having delivered into the vacuum chamber 103 is passed onto the support members 122 that have been raised to a predetermined position. Then the support members 122 are lowered until their top surfaces become flush with or lower than the top surface of the stage 111, which sets the first conveying carrier 20 at a predetermined position on the stage 111.

A plurality of lifting rods 121 are coupled to the peripheral edge of the cover 124, to lift and lower the cover 124. The lifting rods 121 are driven by another lifting system 123B. The lifting and lowering operation of the cover 124 by the lifting systems 123B can be controlled independently from the operation by the lifting systems 123A.

Figure 9:
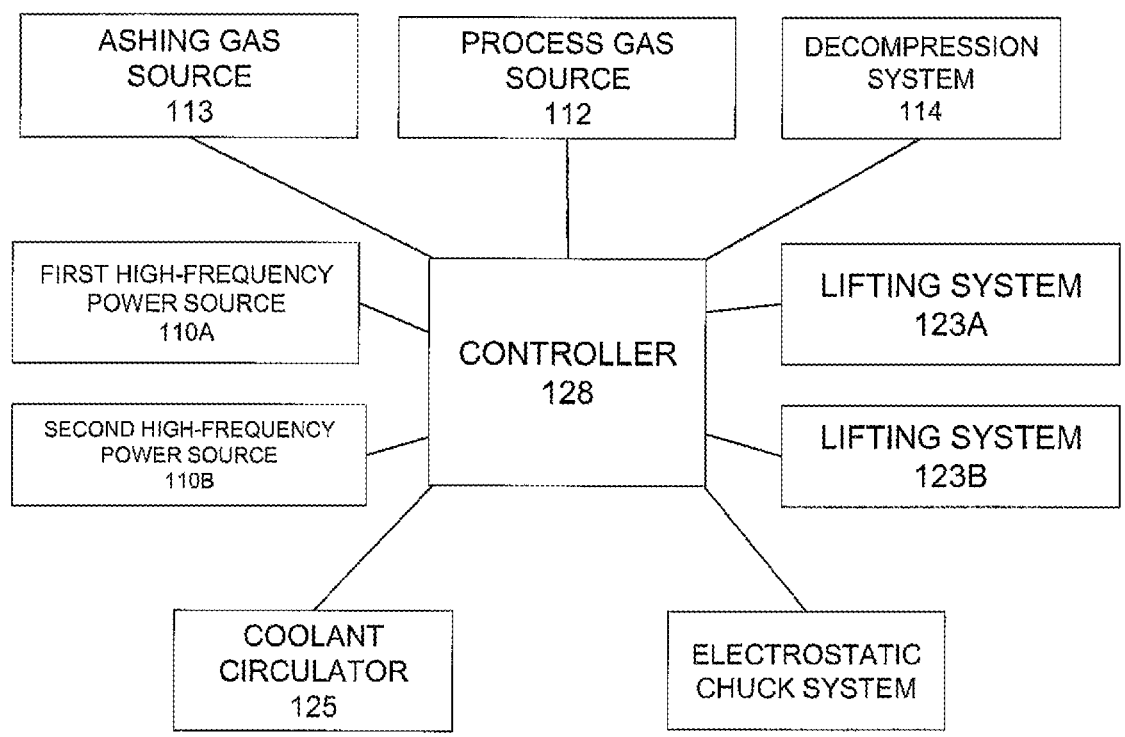
FIG. 9 is a block diagram of the plasma processing unit.

A controller 128 is configured to control operations of component elements of the plasma processing unit 100 including the first high-frequency power source 110A, the second high-frequency power source 110B, the process gas source 112, the ashing gas source 113, the decompression system 114, the coolant circulator 125, the lifting systems 123A and 123B, and the electrostatic chuck system. FIG. 9 is a block diagram of the plasma processing unit.

Figure 10:
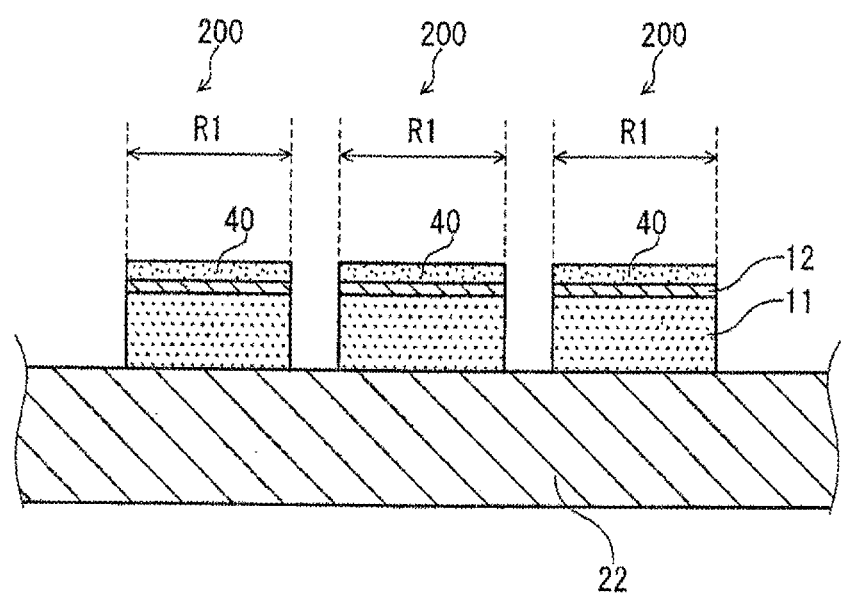
FIG. 10 is a schematic cross-sectional view of element chips produced by a dicing step according to the embodiments of the present invention.

In the dicing step, the substrate 10 is subjected to a first plasma exposure, to etch the dicing regions R2 exposed from the aperture. In this way, the substrate 10 is formed into a plurality of element chips 200. FIG. 10 is a schematic cross-sectional view of an element chip produced by the dicing step.

After the first conveying carrier 20 holding the substrate 10 is delivered into the vacuum chamber 103, the substrate 10 is etched while seated on the stage 111.

When delivering the substrate 10, within the vacuum chamber 103, the cover 124 is lifted to a predetermined position by means of the lifting rods 121. A gate valve (not shown) opens to allow the first conveying carrier 20 to be delivered into the vacuum chamber 103. The support members 122 are on standby at a raised position. When the first conveying carrier 20 reaches a predetermined position above the stage 111, the first conveying carrier 20 is passed onto the support members 122. The first conveying carrier 20 is placed onto the support members 122, with the first surface 22X of the holding sheet 22 faced upward.

After the first conveying carrier 20 is passed onto the support members 122, the vacuum chamber 103 is closed in a hermetically sealed state. Next, the support members 122 start lowering. When the support members 122 are lowered until their top surfaces become flush with or lower than the top surface of the stage 111, the first conveying carrier 20 is set on the stage 111. Then the lifting rods 121 are driven to lower the cover 124 to a predetermined position. The distance between the cover 124 and the stage 111 is adjusted so that the holding members 107 in the cover 124 each come in point-contact with the frame 21. In this way, the frame 21 is pressed downward by the holding members 107, and covered with the cover 124, with at least part of the substrate 10 exposed from the window 124W.

The cover 124 is, for example, doughnut-shaped having an approximately circular outline, and has a consistent width and thin thickness. The inner diameter of the cover 124 (i.e., the diameter of the window 124W) is smaller than that of the frame 21, and the outer diameter of the cover 124 is greater than that of the frame 21. Therefore, when the cover 124 is lowered while the first conveying carrier 20 is set on the stage at a predetermined position, the cover 124 can cover the frame 21, with at least part of the substrate 10 exposed from the window 124W.

The cover 124 is formed of, for example, a dielectric such as ceramics (e.g., alumina, aluminum nitride) or quarts, or a metal such as aluminum with or without an anodic oxidation coating. The holding members 107 can be formed of the aforementioned dielectric or metal, or a resin material.

After the first conveying carrier 20 is passed onto the support members 122, voltage is applied to the ESC electrode 119 from the DC power source 126. By doing this, the holding sheet 22 is brought into contact with the stage 111 and concurrently it is electrostatically chucked on the stage 111. The voltage application to the ESC electrode 119 may be initiated after the holding sheet 22 is set on (or in contact with) the stage 111.

In this step, the substrate 10 is subjected to the first plasma exposure, to etch the dicing regions R1 exposed from the aperture, thereby to form a plurality of element chips from the substrate 10. In this way, the plurality of element chips 200 can be obtained in a state of being held on the holding sheet 22.

The conditions for plasma generation may be set according to the material of the semiconductor layer 11 to be etched, and other factors.

The semiconductor layer 11 is plasma-etched by, for example, the Bosch process. In the Bosch process, the semiconductor layer 11 is etched vertically in the depth direction. When the semiconductor layer 11 contains Si, the Bosch process repeats a film deposition step, a deposited-film etching step, and an Si etching step in this order, thereby to dig the semiconductor layer 11 in the depth direction.

The film deposition step is carried out, for example, under the following conditions: while supplying $C_4F_8$ as a process gas at a rate of 150 to 250 sccm, the pressure in the vacuum chamber 103 is controlled to 15 to 25 Pa, with the input power to the first electrode 109 from the first high-frequency power source 110A set at 1500 to 2500 W, the input power to the second electrode 120 from the second high-frequency power source 110B set at 0 to 50 W; the processing time is 2 to 15 sec.

The deposited-film etching step is carried out, for example, under the following conditions: while supplying $SF_6$ as a process gas at a rate of 200 to 400 sccm, the pressure in the vacuum chamber 103 is controlled to 5 to 15 Pa, with the input power to the first electrode 109 from the first high-frequency power source 110A set at 1500 to 2500 W, the input power to the second electrode 120 from the second high-frequency power source 110B set at 300 to 1000 W; the processing time is 2 to 10 sec.

The Si etching step is carried out, for example, under the following conditions: while supplying $SF_6$ as a process gas at a rate of 200 to 400 sccm, the pressure in the vacuum chamber 103 is controlled to 5 to 15 Pa, with the input power to the first electrode 109 from the first high-frequency power source 110A set at 1500 to 2500 W, the input power to the second electrode 120 from the second high-frequency power source 110B set at 50 to 500 W; the processing time is 10 to 20 sec.

The film deposition step, the deposited-film etching step, and the Si etching step are repeated under the conditions as above, the semiconductor layer 11 containing Si can be etched vertically in the depth direction at a rate of 10 to 20 μm/min.

The circuit layer 12 containing a metal material can be plasma-etched, for example, under the following conditions. While supplying a mixed gas of $CF_4$ and Ar ($CF_4$:Ar=1:4) as a process gas at a rate of 150 to 250 sccm, the pressure in the vacuum chamber 103 is controlled to 0.2 to 1.5 Pa. A high-frequency power of 1500 to 2500 W at a frequency of 13.56 MHz is supplied to the first electrode 109 from the first high-frequency power source 110A. A high-frequency power of 500 to 1800 W at a frequency of 100 kHz or higher (e.g., 400 to 500 kHz or 13.56 MHz) is supplied to the second electrode 120 from the second high-frequency power source 110B.

After the substrate 10 is etched and individualized, the gas in the vacuum chamber 103 is evacuated, and the gate valve opens. The first conveying carrier 20 holding the element chips 200 is unloaded from the plasma processing unit 100 by means of a loading system having entered through the gate valve. After the first conveying carrier 20 is unloaded, the gate valve is immediately closed. The first conveying carrier 20 may be unloaded by performing the above-mentioned loading procedures of setting the first conveying carrier 20 on the stage 11 in the reverse order. Specifically, after the cover 124 is lifted to a predetermined position, the voltage applied to the ESC electrode 119 is cut off, to release the first conveying carrier 20 from the stage 111. Then, the support members 122 are raised. After the support members 122 reaches a predetermined raised position, the first conveying carrier 20 is unloaded from the vacuum chamber 103.

Before raising the support members 122, the substrate 10 and the holding sheet 22 may be subjected to static elimination. Static elimination is performed by, for example, generating a weak plasma in the vacuum chamber 103 using oxygen or noble gas, and exposing the substrate 10 and the holding sheet 22 to this plasma atmosphere. The conditions for generating a weak plasma are, for example, as follows: while supplying argon gas as a process gas at a rate of 100 sccm, the pressure in the vacuum chamber 103 is controlled to 5 to 15 Pa, with the input power to the first electrode 109 from the first high-frequency power source 110A set at 100 to 500 W.

After the substrate 10 is individualized, and before the first conveying carrier 20 is unloaded, ashing may be performed. This can remove the protective film 40 (mask) exposed from the window 124W of the cover 124.

Ashing is performed, for example, under the following conditions: while supplying a mixed gas of $CF_4$ and $O_2$ (flow rate ratio $CF_4:O_2=1:10$) as an ashing gas at a rate of 150 to 300 sccm, the pressure in the vacuum chamber 103 is controlled to 5 to 15 Pa, with the input power to the first electrode 109 from the first high-frequency power source 110A set at 1500 to 5000 W, the input power to the second electrode 120 from the second high-frequency power source 110B set at 0 to 300 W. The input power to the second electrode 120 in the ashing step is preferably set lower than that in the patterning step.

When the protective film 40 is water-soluble, the protective layer 40 may be removed by washing with water, instead of ashing.

Lastly, the element chips 200 are picked up from the holding sheet 22.

The element chips 200 are, for example, pushed up together with the holding sheet 22 by push-up pins from the second surface 22Y side of the holding sheet 22. This causes at least part of the element chips 200 to float up from the holding sheet 22. Then, the element chips 200 are picked up from the holding sheet 22 by a pick-up unit.

The manufacturing method according to the present invention is useful as a method of manufacturing element chips by means of plasma etching, from the substrate attached on the first conveying carrier.

REFERENCE NUMERALS

10: substrate
10X: third surface
10Y: fourth surface
11: semiconductor layer
12: circuit layer
20: first conveying carrier
21: frame
21a: notch
21b: corner cut
22: holding sheet
22X: first surface
22Y: second surface
40: protective film
60, 60A, 60B: second conveying carrier
61: first portion
62: second portion
63: third portion
64: fourth portion
100: plasma processing unit
103: vacuum chamber
103a: gas inlet
103b: gas outlet
108: dielectric member
109: first electrode
110A: first high-frequency power source
110B: second high-frequency power source
111: stage
112: process gas source
113: ashing gas source
114: decompression system
115: electrode layer
116: metal layer
117: base table
118: peripheral member
119: ESC electrode
120: second electrode
121: lifting rod
122: support member
123A, 123B: lifting system
124: cover
124W: window
125: coolant circulator
126: DC power source
127: coolant channel
128: controller
129: circumferential ring
200: element chip
300: push-up pin

What is claimed is:

1. An element chip manufacturing method comprising:
    a preparing step of preparing a first conveying carrier including a holding sheet and a frame, and a substrate held on the holding sheet, the holding sheet having a first surface and a second surface opposite the first surface, the frame attached to at least part of a peripheral edge of the holding sheet;
    a placing step of placing the first conveying carrier holding the substrate, on a second conveying carrier, the second conveying carrier being able to be conveyed together with the first conveying carrier;
    a preprocessing step of preprocessing the substrate, after the placing step;
    a removing step of removing the second conveying carrier, after the preprocessing step; and
    a dicing step of subjecting the substrate held on the first conveying carrier to plasma exposure, after the removing step, to form a plurality of element chips from the substrate.

2. The element chip manufacturing method of claim 1, wherein
    the substrate is provided with a plurality of element regions, and a dicing region defining the element regions, and has a third surface not facing the first surface of the holding sheet, and a fourth surface opposite the third surface, and
    the preprocessing step includes at least one of:
    a coating step of coating the third surface of the substrate held on the holding sheet with a raw material of a protective film,
    a curing step of curing the raw material, to form the protective film on the third surface, and
    a patterning step of forming an aperture in the protective film, to expose the substrate along the dicing region.

3. The element chip manufacturing method of claim 1, wherein the second conveying carrier supports the substrate, with the holding sheet interposed between the second conveying carrier and the substrate.

4. The element chip manufacturing method of claim 3, wherein a portion of the second conveying carrier, the portion being in contact with the holding sheet, has a rough surface.

5. The element chip manufacturing method of claim 3, wherein a portion of the second conveying carrier, the portion being in contact with the holding sheet, has electrical conductivity.

6. The element chip manufacturing method of claim 1, wherein the second conveying carrier is an annular body, and supports the frame.

7. The element chip manufacturing method of claim 1, wherein the second conveying carrier has a first portion rising so as to surround a circumference of the frame.

\* \* \* \* \*